(12) United States Patent
Yu

(10) Patent No.: US 7,548,114 B2
(45) Date of Patent: Jun. 16, 2009

(54) APPARATUS FOR SLEW RATE ENHANCEMENT OF AN OPERATIONAL AMPLIFIER

(75) Inventor: Chung-Wei Yu, Taipei (TW)

(73) Assignee: Sitronix Technology Corp., Hsinchu Hsien (TW)

( * ) Notice: Subject to any disclaimer, the term of this patent is extended or adjusted under 35 U.S.C. 154(b) by 62 days.

(21) Appl. No.: 11/907,065

(22) Filed: Oct. 9, 2007

(65) Prior Publication Data

US 2009/0091388 A1    Apr. 9, 2009

(51) Int. Cl.
 *H03F 3/26* (2006.01)
(52) U.S. Cl. .................................... 330/255; 330/267
(58) Field of Classification Search ............ 330/255, 330/267
See application file for complete search history.

(56) References Cited

U.S. PATENT DOCUMENTS 6,278,322 B1 * 8/2001 Aisu et al. ............... 330/255
6,392,485 B1 * 5/2002 Doi et al. ................. 330/253
2005/0179495 A1 * 8/2005 Sung ........................ 330/255
2006/0197591 A1 * 9/2006 Hsieh ........................ 330/51

* cited by examiner

*Primary Examiner*—Steven J Mottola
(74) *Attorney, Agent, or Firm*—Muncy, Geissler, Olds & Lowe, PLLC

(57) ABSTRACT

The present invention discloses an apparatus for slew rate enhancement of an operational amplifier, wherein an auxiliary control device and an auxiliary output device are added to the output stage of an operational amplifier. The auxiliary control device mirrors the current of the output stage and then compares the mirrored current with a reference current to generate an auxiliary push/pull control signal, which is used to control the auxiliary output device. When the output signal is different from the input signal, the auxiliary control device turns on the auxiliary output device to provide an auxiliary output current for the output terminal. When the output signal is equal to the input signal, the auxiliary output device is turned off.

3 Claims, 3 Drawing Sheets

APPARATUS FOR SLEW RATE ENHANCEMENT OF AN OPERATIONAL AMPLIFIER

FIELD OF THE INVENTION

The present invention relates to an operational amplifier applying to a negative-feedback unity-gain buffer, particularly to an apparatus for slew rate enhancement of an operational amplifier, wherein the comparison result of a mirrored current is used to control an auxiliary output device.

BACKGROUND OF THE INVENTION

In a conventional operational amplifier, high slew rate is achieved via increasing the current of a differential input pair or decreasing compensation capacitance. However, increasing the current of a differential input pair will increase static current consumption, and decreasing compensation capacitance will deteriorate the stability of the operational amplifier.

Another conventional method to achieve a high slew rate, wherein error amplifiers are utilized to drive a complementary common-source output stage, is shown in FIG. 1. This apparatus includes: an operational amplifier 11, two error amplifiers 12 and 13, a PMOS (P-type Metal Oxide Semiconductor) FET (Field Effect Transistor) 14 and an NMOS (N-type Metal Oxide Semiconductor) FET 15. The error amplifiers 12 and 13 are used to control the PMOS FET 14 and NMOS FET 15 of the output stage, which is implemented via coupling the inverting terminals of the error amplifiers 12 and 13 to the output terminal of the operational amplifier 11 and coupling the non-inverting terminals to an output node Vout. Further, a negative feedback loop comprising the error amplifier 12 and the PMOS FET 14 and a negative feedback loop comprising the error amplifier 13 and the NMOS FET 15 are used to control the push-pull common source output stage formed by a PMOS FET 14 and a NMOS FET 15.

In the conventional high slew rate operational amplifier, when the output voltage V0 is smaller than the output voltage V1 of the operational amplifier 11, the output voltage V2 of the error amplifier 12 will therefore decrease so as to enhance the conductivity of the PMOS FET 14, and the output voltage V3 of the error amplifier 13 will therefore decrease so as to attenuate the conductivity of the NMOS FET 15 or even turn off the NMOS FET 15. Consequently, the PMOS FET 14 will push (or source) current to the output node Vout. When the output voltage V0 is greater than the output voltage V1 of the operational amplifier 11, the output voltage V2 of the error amplifier 12 will therefore increase so as to attenuate the conductivity of the PMOS FET 14 or even turn off the PMOS FET 14, and the output voltage V3 of the error amplifier 13 will therefore increase so as to enhance the conductivity of the NMOS FET 15. Consequently, the NMOS FET 15 will pull (or sink) current from the output node V0.

When the output voltage V0 is equal to the output voltage V1 of the operational amplifier 11, the output voltage V2 of the error amplifier 12 will bias the PMOS FET 14 with a static current Ib, and the output voltage V3 of the error amplifier 13 will bias the NMOS FET 15 with a exactly the same static current Ib. In other words, when the input is equal to the output, the PMOS FET 14 and NMOS FET 15 operate at the predetermined DC bias condition.

The abovementioned architecture is generally used to drive a heavy load, such as a circuit of small resistances or large capacitances. The aspect ratio of the PMOS FET 14 and NMOS FET 15 thereof has to be very large, making this apparatus area inefficient. Besides, offset voltage, layout symmetry, bandwidth and noise have to be taken into consideration in the design of an error amplifier. Therefore, this apparatus has a complicated circuit structure, which occupies a great area of the chip and consumes considerable static power.

SUMMARY OF THE INVENTION

The objective of the present invention is to provide an apparatus for slew rate enhancement of an operational amplifier while negligibly increasing the static current consumption and keeping the pole-zero behaviors unaltered.

The present invention is used to increase the slew rate of an operational amplifier and applies to an operational amplifier having a push-pull output stage for a negative-feedback unity-gain buffer. The apparatus of the present invention comprises: an operational amplifier, an auxiliary control device and an auxiliary output device. The operational amplifier includes: an input stage, a control stage and a main output stage. The input stage receives an input signal. The amplifier processes the input signal and then generates output signals from the output stage. The main output stage is formed via cascading a push transistor and a pull transistor. The push transistor is controlled by a push control node of the control stage, and the pull transistor is controlled by a pull control node of the control stage. An auxiliary control device is coupled to the push control node and pull control node of the control stage. The auxiliary control device mirrors the current of the main output stage and compares the mirrored current with a reference current to generate an auxiliary push control signal and an auxiliary pull control signal. The auxiliary output device is coupled to the output stage and controlled by the auxiliary push control signal and auxiliary pull control signal of the auxiliary control device. When the output voltage differs from the input voltage, the auxiliary control device turns on the auxiliary output device to provide an auxiliary current for the output terminal. When the output voltage equals to the input voltage, the auxiliary output device turns off the auxiliary output device and therefore no auxiliary current is provided.

The auxiliary output device includes: an auxiliary push transistor and an auxiliary pull transistor. The gate of the auxiliary push transistor is coupled to the auxiliary push control signal, the source of the auxiliary push transistor is coupled to the first supply rail, and the drain of the auxiliary push transistor is coupled to the output terminal of the operational amplifier. The gate of the auxiliary pull transistor is coupled to the auxiliary push control signal, the source of the auxiliary pull transistor is coupled to the second supply rail, and the drain of the auxiliary pull transistor is coupled to the output terminal of the operational amplifier.

The auxiliary control device includes a push control device and a pull control device. The push control device has a first current comparator and a first conversion device. The first current comparator receives a first mirrored current via a first mirroring transistor, which mirrors the current of the push transistor of the main output stage. The first current comparator compares the first mirrored current with a first reference current and thereof generates a first control signal coupled to a first conversion device. According to the first control signal, the first conversion device outputs an auxiliary push control signal to control the auxiliary push transistor of the auxiliary output device. The pull control device has a second current comparator and a second conversion device. The second current comparator receives a second mirrored current via a second mirroring transistor, which mirrors the current of the pull transistor of the main output stage. The second current comparator compares the second mirrored current with a second reference current and thereof generates a second control signal coupled to a second conversion device. According to the second control signal, the second control signal, the second conversion device outputs an auxiliary pull control signal to control the auxiliary pull transistor of the auxiliary output device.

The present invention deploys an auxiliary control device and an auxiliary output device to an operational amplifier. An auxiliary control device mirrors the current of the main output stage and a current comparator thereby compares the mirrored current with a reference current. By monitoring the output current of the main output stage, the auxiliary control device can rapidly generate an auxiliary push/pull control signal to control the auxiliary output device. When the output voltage differs from the input voltage, the auxiliary control device turns on the auxiliary output device to provide an auxiliary output current for the output terminal. When the output voltage equals to the input voltage, the auxiliary control device turns off the auxiliary output device and no auxiliary output current is provided. Furthermore, a hysteresis device can be incorporated in the current comparator to adjust the conduction time of the auxiliary output device. Compared with the conventional voltage-mode comparator, a current comparator of the present invention can more rapidly respond to the voltage difference between the input and output voltage.

DETAILED DESCRIPTION OF THE PREFERRED EMBODIMENTS

Below, a preferred embodiment of the present invention will be described in detail. However, it should be understood that the embodiments are only to exemplify the present invention but not to limit the scope of the present invention.

Figure 1:
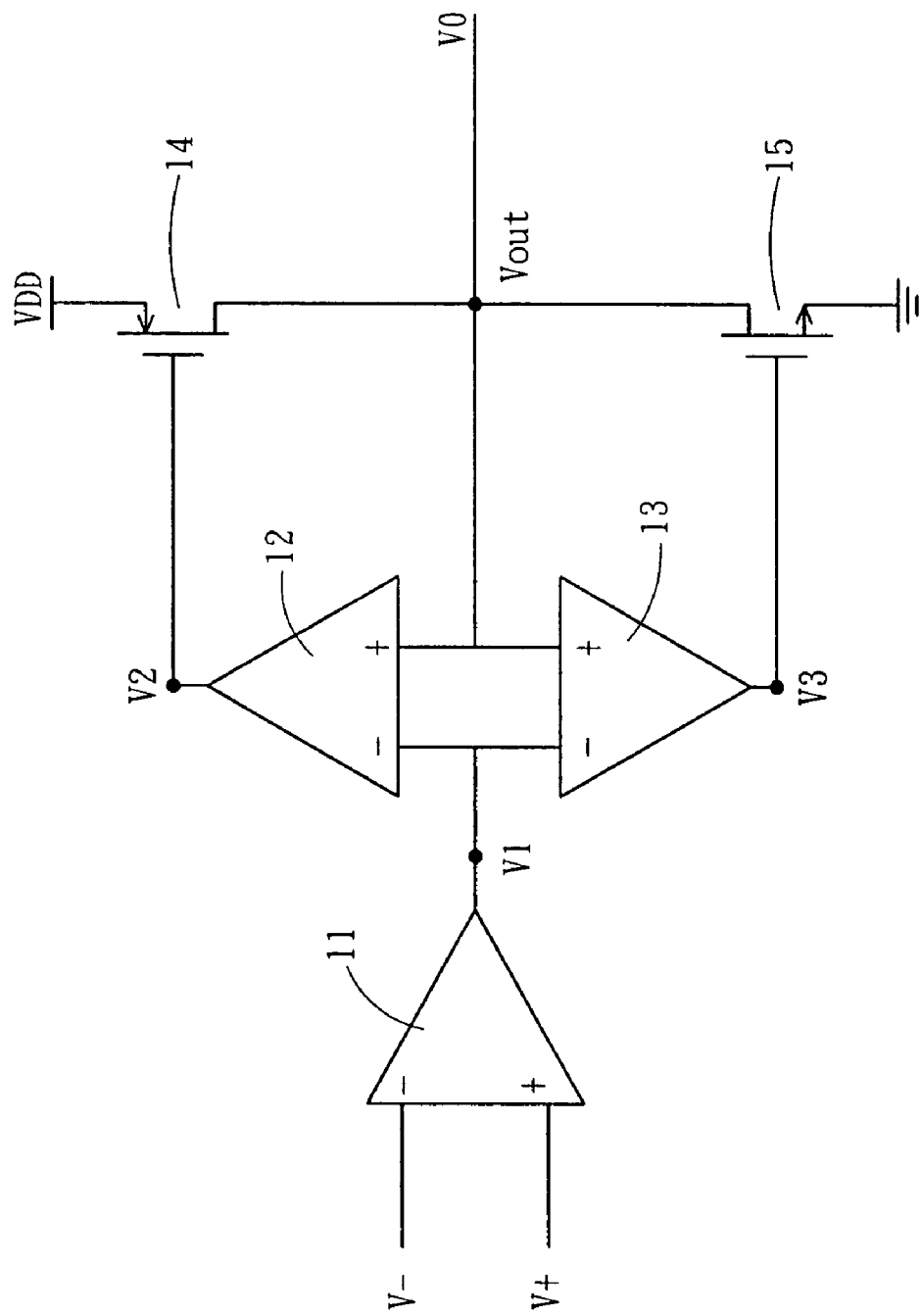
FIG. 1 is a schematic view showing a conventional high slew rate operational amplifier.
Figure 2:
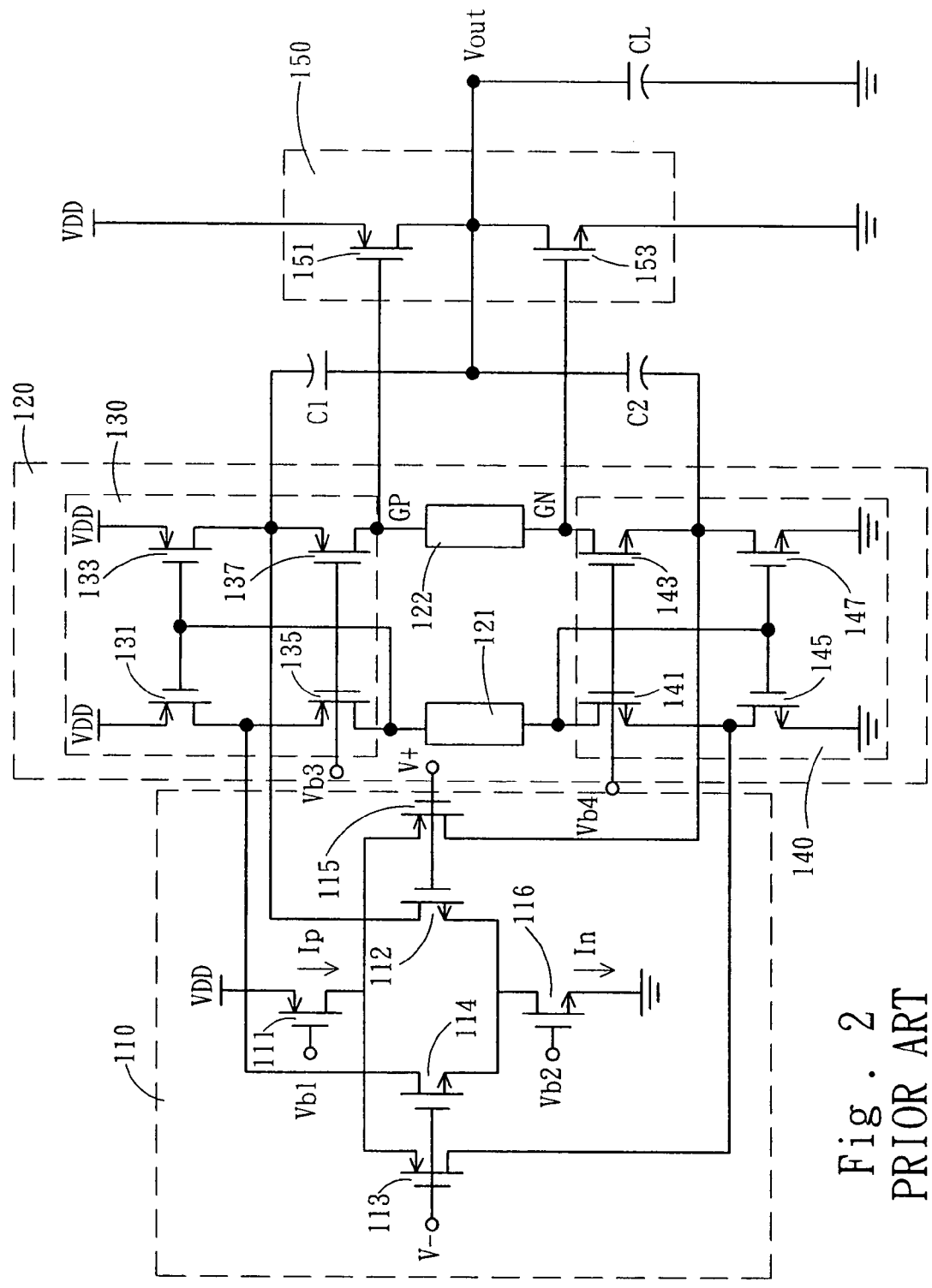
FIG. 2 is a schematic view showing a conventional class AB operational amplifier.

FIG. 2 is a schematic view showing a conventional class-AB operational amplifier. As shown in this figure, the operational amplifier comprises: an input stage 110, a class-AB control stage 120 and an output stage 150. The input stage 110 includes a P-type input stage and an N-type input stage; the P-type input stage further comprises P-type transistors 111, 113 and 115, and the P-type transistor 111 is the current source thereof; the N-type input stage further comprises N-type transistors 112, 114 and 116, and the N-type transistor 116 is the current source thereof. The class AB control stage 120 includes a P-type active load 130 and an N-type active load 140; the P-type active load 130 further comprises four P-type transistors 131, 133, 135 and 137; the N-type active load 140 further comprises four N-type transistor 141, 143, 145 and 147. The output stage 150 is formed via cascading a P-type transistor 151 and a N-type transistor 153.

The non-inverting input terminal V+ is coupled to the gates of the P-type transistor 115 and N-type transistor 112. The inverting input terminal V− is coupled to the gates of the P-type transistor 113 and N-type transistor 114. The drains of the P-type transistors 113 and 115 are coupled to the N-type active load 140; the drains of the N-type transistors 112 and 114 are coupled to the P-type active load 130. The P-type active load 130 is coupled to the N-type active load 140 via resistors 121 and 122. In the output stage 150, the drains of the push transistor 151 and pull transistor 153 are coupled to the output terminal Vout. The gate of the push transistor 151 is coupled to and controlled by a push control node GP between the P-type active load 130 and the resistor 122. The gate of the pull transistor 153 is coupled to and controlled by a pull control node GN between the N-type active load 140 and the resistor 122. One plate of the compensation capacitor C1 is coupled to between the P-type transistors 133 and 137 of the P-type active load 130, and the other plate is coupled to the output terminal Vout of the output stage 150. One plate of the compensation capacitor C2 is coupled to between the N-type transistors 143 and 147 of the N-type active load 140, and the other plate is coupled to the output terminal Vout of the output stage 150.

Biases Vb1-Vb4 are used to setup the quiescent states of the transistors. In more details, bias Vb1 is coupled to the gate of the P-type transistor 111 and therefore biases the P-type transistor 111 to control the tail current of the P-type input pair of the input stage 110; bias Vb2 is coupled to the gate of the N-type transistor 116 and therefore biases the N-type transistor 116 to control the tail current of the N-type input pair of the input stage 110; bias Vb3 is coupled to the P-type transistors 135 and 137 of the P-type active load 130 to control the bias current thereof; bias Vb4 is coupled to the N-type transistors 141 and 143 of the N-type active load 140 to control the bias current thereof. A capacitor CL is the load to be driven and is connected to the output terminal Vout.

In the abovementioned class-AB operational amplifier, the P-type transistor 111 provides a tail current Ip for the P-type input pair of the input stage 110, and the N-type transistor 116 provides a tail current In for the N-type input pair of the input stage 110. When the voltage of the non-inverting input terminal V+ is equal to the voltage of the inverting input terminal V−, current Ip will equally flows through the P-type transistors 113 and 115; in other words, half of Ip flows through each of the P-type transistor 113 and 115; current In will equally flows through the N-type transistors 112 and 114; in other words, half of In flows through each of the N-type transistor 112 and 114.

When the voltage of the non-inverting input terminal V+ is higher than the voltage of the inverting input terminal V−, almost all of the current In flows to the N-type transistor 112, whereas almost all of the current Ip flows to the P-type transistor 113. The change of current In division between 112 and 114 will cause the source-to-gate voltage Vsg of the push transistor 151 of the output stage 150 to increase through P-type active load 130, thus increasing the current pushed to the load (capacitor CL). The change of current Ip division between 113 and 115 will cause the gate-to-source voltage Vgs of the pull transistor 153 of the output stage 150 to decrease through N-type active load 140, thus decreasing the current pulled from the load (capacitor CL).

When the voltage level the non-inverting input terminal V+ is lower than the voltage of the inverting input terminal V−, almost all of the current In flows to the N-type transistor 114, whereas almost all of the current Ip flows to the P-type transistor 115. The change of current In division between 112 and 114 will cause the source-to-gate voltage Vsg of the push transistor 151 of the output stage 150; to decrease through P-type active load 130, thus decreasing the current pushed to the load (capacitor CL) is decreased. The change of current Ip division between 113 and 115 will cause the gate-to-source voltage Vgs of the pull transistor 153 of the output stage 150 to increase through N-type active load 140, thus increasing the current pulled from the load (capacitor CL).

The resistors 121 and 122 are the elements whereby the class-AB control stage 120 controls the static current consumption of the output stage 150. The elements are exemplified by the resistors 121 and 122 herein; however, other elements, such as transistors, may also be used to perform the same function.

To increase the slew rate of the operational amplifier, the present invention applies an auxiliary output device and an auxiliary control device to the output stage of the original operational amplifier. The auxiliary output device provides an additional current for the load when a large input difference is presented. The auxiliary control device monitors the presence of heavy slewing by comparing the mirrored output stage current with a reference current to simultaneously control the auxiliary output device. When the output voltage is different from the input voltage, the auxiliary output device is thereby turned on to provide an auxiliary output current for the output terminal. When the output voltage is equal to the input voltage, the auxiliary output device is thereby turned off, and no auxiliary output current is provided.

Figure 3:
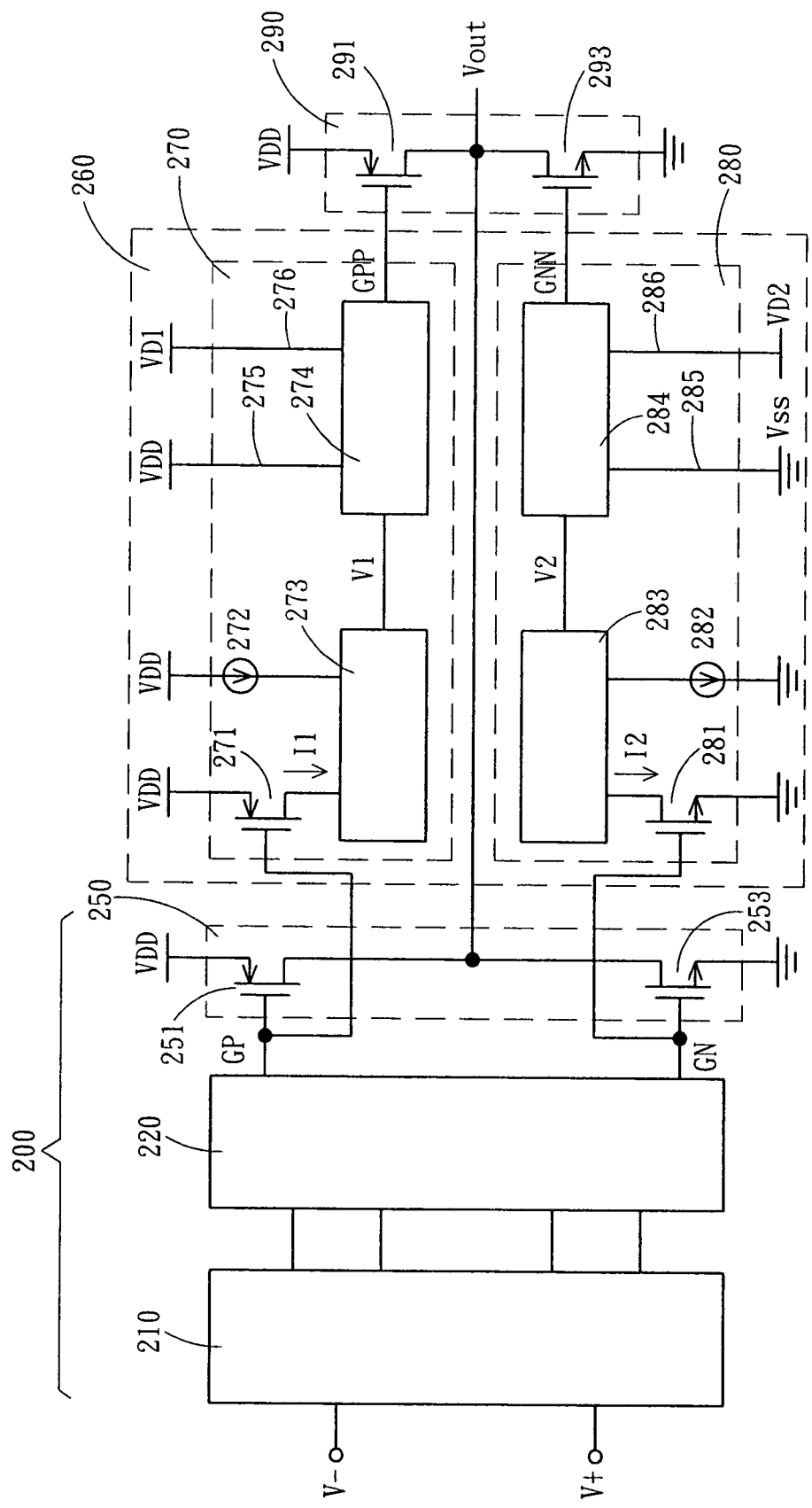
FIG. 3 is a schematics of a preferred embodiment of the present invention.

FIG. 3 is a diagram schematically showing the apparatus for slew rate enhancement of an operational amplifier according to the present invention, wherein the application to a class-AB operational amplifier is used as an exemplification. The apparatus of the present invention comprises: an operational amplifier 200, an auxiliary control device 260 and an auxiliary output device 290. The operational amplifier 200 has an input stage 210, a control stage 220 and an output stage 250. The input stage 210 has a non-inverting input terminal V+ and an inverting input terminal V− for receiving input signals. The operational amplifier 200 processes and amplifies an input signal and then outputs an output signal from the output terminal Vout of the output stage 250. The output stage 250 is formed via cascading a push transistor 251 and a pull transistor 253. The push transistor 251 is controlled by a push control node GP of the control stage 220, and the pull transistor 253 is controlled by a pull control node GN of the control stage 220. The auxiliary control device 260 is coupled to the push control node GP and the pull control node GN of the control stage 220 and mirrors the current of the output stage 250 and then compares the mirrored current with reference currents (272 and 282) to generate an auxiliary push control signal GPP and an auxiliary pull control signal GNN. The auxiliary output device 290 is coupled to the output stage 250 of the operational amplifier 200 and controlled by the auxiliary control device 260. The auxiliary output device 290 includes: an auxiliary push transistor 291 and an auxiliary pull transistor 293. The auxiliary push transistor 291 receives the auxiliary push control signal GPP, and the drain of the auxiliary push transistor 291 is coupled to the output terminal Vout of the operational amplifier 200. The auxiliary pull transistor 293 receives the auxiliary pull control signal GNN, and the drain of the auxiliary pull transistor 293 is coupled to the output terminal Vout of the operational amplifier 200.

The auxiliary control device 260 includes: a push control device 270 and a pull control device 280. The push control device 270 has a first current comparator 273 and a first conversion device 274. The first current comparator 273 receives a first mirrored current I1 via a first mirroring transistor 271, which mirrors the current of the push transistor 251 of the output stage 250. The first current comparator 273 compares the first mirrored current I1 with a first reference current 272 and outputs a first control signal V1 to the first conversion device 274. According to the first control signal V1, the first conversion device 274 switches between a first turn-off signal 275 (such as a power source VDD of the system) and a first turn-on signal 276 (such as a bias voltage VD1) and forms the auxiliary push control signal GPP, which is used to control the auxiliary push transistor 291 of the auxiliary output device 290.

The pull control device 280 has a second current comparator 283 and a second conversion device 284. The second current comparator 283 receives a second mirrored current I2 via a second mirroring transistor 281, which mirrors the current of the pull transistor 253 of the output stage 250. The second current comparator 283 compares the second mirrored current I2 with a second reference current 282 and outputs a second control signal V2 to the second conversion device 284. According to the second control signal V2, the second conversion device 284 switches between a second turn-off signal 285 (such as a ground source $V_{SS}$ of the system) and a second turn-on signal 286 (such as a bias voltage VD2) and forms the auxiliary pull control signal GNN, which is used to control the auxiliary pull transistor 293 of the auxiliary output device 290.

When the operational amplifier 200 is in the steady state, i.e., when the voltage of the non-inverting input terminal V+ is equal to the voltage of the inverting input terminal V−, the first mirrored current I1 mirrored by the first mirror transistor 271 is smaller than the first reference current 272. Thus, the first control signal V1 outputs a logic "low", and the first conversion device 274 switches the auxiliary push control signal GPP into the first turn-off signal 275. Therefore, the auxiliary push transistor 291 of the auxiliary output device 290 is turned off. Meanwhile, the second mirrored current I2 mirrored by the second mirror transistor 281 is smaller than the second reference current 282. Thus, the second control signal V2 outputs a logic "low", and the second conversion device 284 switches the auxiliary pull control signal GNN into the second turn-off signal 285. Therefore, the auxiliary pull transistor 293 of the auxiliary output device 290 is turned off. In other words, the entire auxiliary output device 290 is shut off during the steady state.

When the input signal of the non-inverting input terminal V+ is greater than input signal of the inverting input terminal V−, the voltage of the push control node GP is greatly reduced, and the push current of the push transistor 251 of the output stage 250 is increased. The current I1 mirrored by the first mirror transistor 271 is thereby greater than the first reference current 272. Thus, the first control signal V1 outputs a logic "high", and the first conversion device 274 switches the auxiliary push control signal GPP into the first turn-on signal 276. Therefore, the auxiliary push transistor 291 of the auxiliary output device 290 is turned on, enabling the output terminal Vout to source more current to the load. Meanwhile, the voltage of the pull control node GN is lower than that in the steady state. The current I2 mirrored by the second mirror transistor 281 is smaller than the second reference current 282. Thus, the second control signal V2 outputs logic "low", and the second conversion device 284 keeps the auxiliary pull control signal GNN at the second turn-off signal 285. Therefore, the auxiliary pull transistor 293 of the auxiliary output device 290 is turned off.

When the input signal of the non-inverting input terminal V+ is smaller than the input signal of the inverting input terminal V−, the voltage of the push control node GP is higher than that in the steady state. The current I1 mirrored by the first mirror transistor 271 is smaller than the first reference current 272. Thus, the first control signal V1 outputs a logic "low", and the first conversion device 274 keeps the auxiliary push control signal GPP at the first turn-off signal 275. Therefore, the auxiliary push transistor 291 of the auxiliary output device 290 is turned off. Meanwhile, the voltage of the pull control node GN is greatly increased, and the pull current of the push transistor 253 of the output stage 250 is increased. The current I2 mirrored by the second mirror transistor 281 is thereby greater than the second reference current 282. Thus, the second control signal V2 outputs a logic "high", and the second conversion device 284 switches the auxiliary pull control signal GNN into the second turn-on signal 286. Therefore, the auxiliary pull transistor 293 of the auxiliary output device 290 is turned on, enabling the output terminal Vout to sink more current from the load.

By monitoring the current of the output stage, the present invention can simultaneously generate auxiliary push/pull control signals to control the auxiliary output device. When the output signal is different from the input signal, the auxiliary output device is turned on to provide an auxiliary sinking/sourcing output current for the output terminal. When the output signal is equal to the input signal, the auxiliary output device is turned off accordingly. Alternatively, a hysteresis circuit may also be deployed in the current comparator to control the on-off timing of the auxiliary push/pull transistor in accordance with different output loading conditions. Compared with the conventional technologies that control is implemented with voltage-mode operations, the present invention can more quickly respond to the variation of the input terminal to increase the slew rate of an operational amplifier. Further, the present invention has a simple circuit structure, which can be directly applied to the existing class-AB operational amplifiers without tedious design modifications.

Those described above are only the preferred embodiments to exemplify the present invention but not to limit the scope of the present invention. Any equivalent modification or variation according to the spirit of the present invention is to be also included within the scope of the present invention.

What is claimed is:

1. An apparatus for slew rate enhancement of an operational amplifier comprising:

an operational amplifier having an input stage, a control stage and an output stage, wherein said input stage receives an input signal; said operational amplifier processes and amplifies said input signal and then outputs an output signal from an output terminal of said output stage; said output stage is formed via cascading a push transistor and a pull transistor; said push transistor is controlled by a push control node of said control stage, and said pull transistor is controlled by a pull control node of said control stage;

an auxiliary control device coupled to said push control node and said pull control node of said control stage, mirroring a current of said output stage and comparing the mirrored current with a reference current to generate an auxiliary push control signal and an auxiliary pull control signal; and an auxiliary output device coupled to said output stage of said operational amplifier and controlled by said auxiliary push control signal and said auxiliary pull control signal of said auxiliary control device, wherein when said output voltage is different from said input voltage, said auxiliary control device turns on said auxiliary output device to provide an auxiliary output current for said output terminal; when said output voltage is equal to said input voltage, said auxiliary output device is turned off, and none said auxiliary output current is provided.

2. The apparatus for slew rate enhancement of the operational amplifier according to claim 1, wherein said auxiliary output device further comprises:

an auxiliary push transistor receiving said auxiliary push control signal with the output terminal thereof coupled to said output terminal of said operational amplifier; and an auxiliary pull transistor receiving said auxiliary pull control signal with the output terminal thereof coupled to said output terminal of said operational amplifier.

3. The apparatus for slew rate enhancement of the operational amplifier according to claim 1, wherein said auxiliary control device further comprises:

a push control device having a first current comparator and a first conversion device, wherein said first current comparator receives a first mirrored current output by a first mirroring transistor, which mirrors said push transistor of said output stage and is controlled by said push control node of said control stage; said first current comparator compares said first mirrored current with a first reference current and outputs a first control signal to said first conversion device; according to said first control signal, said first conversion device switches between a first turn-off signal and a first turn-on signal and forms said auxiliary push control signal, which is used to control an auxiliary push transistor of said auxiliary output device; and a pull control device having a second current comparator and a second conversion device, wherein said second current comparator receives a second mirrored current output by a second mirroring transistor, which mirrors said pull transistor of said output stage and is controlled by said pull control node of said control stage; said second current comparator compares said second mirrored current with a second reference current and outputs a second control signal to said second conversion device; according to said second control signal, said second conversion device switches between a second turn-off signal and a second turn-on signal and forms said auxiliary pull control signal, which is used to control an auxiliary pull transistor of said auxiliary output device.

* * * * *